(12) United States Patent
Briere

(10) Patent No.: US 11,605,628 B2
(45) Date of Patent: Mar. 14, 2023

(54) INTEGRATED III-NITRIDE AND SILICON DEVICE

(71) Applicant: Infineon Technologies Americas Corp., El Segundo, CA (US)

(72) Inventor: Michael A. Briere, Scottsdale, AZ (US)

(73) Assignee: Infineon Technologies Americas Corp., El Segundo, CA (US)

(*) Notice: Subject to any disclaimer, the term of this patent is extended or adjusted under 35 U.S.C. 154(b) by 156 days.

(21) Appl. No.: 13/945,276

(22) Filed: Jul. 18, 2013

(65) Prior Publication Data

US 2013/0299877 A1 Nov. 14, 2013

Related U.S. Application Data

(63) Continuation of application No. 12/174,329, filed on Jul. 16, 2008, now abandoned.

(60) Provisional application No. 60/990,142, filed on Nov. 26, 2007, provisional application No. 60/950,261, filed on Jul. 17, 2007.

(51) Int. Cl.

| | |
|---|---|
| *H01L 27/06* | (2006.01) |
| *H01L 29/04* | (2006.01) |
| *H01L 29/417* | (2006.01) |
| *H01L 29/423* | (2006.01) |
| *H01L 29/66* | (2006.01) |
| *H01L 29/778* | (2006.01) |
| *H01L 21/8258* | (2006.01) |
| *H01L 29/20* | (2006.01) |

(52) U.S. Cl.
CPC ...... *H01L 27/0617* (2013.01); *H01L 21/8258* (2013.01); *H01L 27/0688* (2013.01); *H01L 29/045* (2013.01); *H01L 29/4175* (2013.01); *H01L 29/42316* (2013.01); *H01L 29/66462* (2013.01); *H01L 29/7786* (2013.01); *H01L 29/2003* (2013.01)

(58) Field of Classification Search
CPC ............... H01L 29/045; H01L 29/4175; H01L 27/0617; H01L 29/66462; H01L 29/7786; H01L 29/42316; H01L 29/2003
USPC ............ 257/20, 195, 201, E29.091, E29.068
See application file for complete search history.

(56) References Cited

U.S. PATENT DOCUMENTS

| | | | | |
|---|---|---|---|---|
| 3,984,782 A | * | 10/1976 | Shizuhara | ............... H03F 1/307 330/269 |
| 4,087,900 A | | 5/1978 | Yiannoulos | |
| 4,093,925 A | * | 6/1978 | Yokoyama | ............ H03F 3/3044 327/109 |
| 4,474,624 A | | 10/1984 | Matthews | |

(Continued)

FOREIGN PATENT DOCUMENTS

| | | |
|---|---|---|
| CN | 1825539 A | 8/2006 |
| KR | 20030049169 A | 6/2003 |

OTHER PUBLICATIONS

HEMT, High Electron Mobility Transistor Tutorial, by Ian Poole. No Date.*

(Continued)

*Primary Examiner* — Hrayr A Sayadian
(74) *Attorney, Agent, or Firm* — Murphy, Bilak & Homiller, PLLC

(57) ABSTRACT

A III-nitride device that includes a silicon body having formed therein an integrated circuit and a III-nitride device formed over a surface of the silicon body.

15 Claims, 3 Drawing Sheets

(56) References Cited

U.S. PATENT DOCUMENTS

| | | | | |
|---|---|---|---|---|
| 4,733,194 | A * | 3/1988 | Roehrs | H03F 1/0277 330/251 |
| 4,774,205 | A * | 9/1988 | Choi | H01L 21/8258 148/DIG. 149 |
| 4,826,784 | A * | 5/1989 | Salerno | H01L 21/02381 117/95 |
| 4,940,672 | A * | 7/1990 | Zavracky | H01L 21/8252 148/DIG. 26 |
| 4,996,133 | A * | 2/1991 | Brighton | H01L 21/76804 257/E21.578 |
| 5,084,637 | A | 1/1992 | Gregor | |
| 5,606,186 | A * | 2/1997 | Noda | H01L 21/8258 257/146 |
| 5,914,619 | A * | 6/1999 | Tihanyi | H03K 17/102 327/109 |
| 6,140,675 | A | 10/2000 | Sugiura | |
| 6,187,683 | B1 * | 2/2001 | De Santi | H01L 21/31051 257/E21.243 |
| 6,255,198 | B1 * | 7/2001 | Linthicum | H01L 21/02381 257/103 |
| 7,737,429 | B2 * | 6/2010 | Kim | H01L 21/02381 257/11 |
| 2002/0064906 | A1 * | 5/2002 | Enquist | H01L 31/0465 438/109 |
| 2003/0015767 | A1 * | 1/2003 | Emrick | H01L 21/8258 257/528 |
| 2003/0034547 | A1 | 2/2003 | Johnson | |
| 2003/0132433 | A1 * | 7/2003 | Piner | H01L 21/02455 257/19 |
| 2004/0069289 | A1 | 4/2004 | Ito | |
| 2005/0056913 | A1 | 3/2005 | Farnworth | |
| 2005/0184343 | A1 * | 8/2005 | Thornton | H01L 29/812 257/351 |
| 2006/0001161 | A1 | 1/2006 | Graettinger | |
| 2006/0043501 | A1 | 3/2006 | Saito | |
| 2006/0060871 | A1 | 3/2006 | Beach | |
| 2006/0091408 | A1 * | 5/2006 | Kim | H01L 21/02381 257/94 |
| 2006/0097407 | A1 | 5/2006 | Ito | |
| 2006/0220699 | A1 * | 10/2006 | Labbe | H03K 17/08122 327/108 |
| 2006/0273347 | A1 | 12/2006 | Hikita | |
| 2006/0289876 | A1 | 12/2006 | Briere | |
| 2007/0176238 | A1 | 8/2007 | Seacrist | |
| 2007/0210333 | A1 * | 9/2007 | Lidow | H01L 25/18 257/200 |
| 2008/0308835 | A1 | 12/2008 | Pan | |
| 2009/0050939 | A1 * | 2/2009 | Briere | H01L 29/045 257/201 |
| 2011/0095335 | A1 * | 4/2011 | Ishida | H01L 29/0611 257/190 |
| 2011/0136325 | A1 * | 6/2011 | Briere | H01L 29/7786 438/478 |
| 2013/0299877 | A1 * | 11/2013 | Briere | H01L 21/8258 257/192 |
| 2015/0357457 | A1 * | 12/2015 | Ritenour | H01L 29/517 257/76 |

OTHER PUBLICATIONS

American Heritage Dictionary definition of "cover." No Date!*
"Comprehensive Dictionary of Electrical Engineering," Phillip A Laplante (Editor), published in 2005 by the CRC, the title page and the copyright pagets, and p. 323.*
Merriam-Webster ONLine Dictionary definition of face. No Date!*
*Complete Guide to Semiconductor Device*, Second Edition, by Ng, 2002.

* cited by examiner

INTEGRATED III-NITRIDE AND SILICON DEVICE

This is a continuation of application Ser. No. 12/174,329 filed Jul. 16, 2008.

RELATED APPLICATION

This application is based on and claims priority to U.S. Provisional Application Ser. No. 60/950,261, filed on Jul. 17, 2007, entitled Monolithic Si IC and GaN FET Using Vias, and U.S. Provisional Application Ser. No. 60/990,142, filed on Nov. 26, 2007, entitled III-Nitride Wafer and Devices Formed in a III-Nitride Wafer, to which claims of priority are hereby made and the disclosures of which are incorporated by reference.

DEFINITION

III-nitride as used herein refers to a semiconductor alloy from the InAlGaN system that includes nitrogen and at least one element from Group III such as, but not limited to, GaN, AlGaN, InN, AlN, InGaN, InAlGaN and the like.

BACKGROUND AND SUMMARY OF THE INVENTION

The present invention relates to III-nitride device technology.

III-nitride, because of its high bandgap, is suitable for high voltage power applications. According to a known design, a III-nitride power device may be fabricated by forming a III-nitride heterojunction over a silicon substrate.

It is also known that integrated circuits for driving power devices such as III-nitride power devices can be formed in silicon using, for example, CMOS technology.

Given the desire to lower power consumption and/or increase switching speed by reducing interconnection inductance and resistance, it is desirable to position, for example, an integrated driver circuit (IC) close to a power device.

In a device according to present invention an IC is formed in a silicon body a surface of which also serves as a substrate for a III-nitride device, such as a III-nitride power device. The IC and the power device can be then operatively coupled, whereby an integrated device may be obtained.

Other features and advantages of the present invention will become apparent from the following description of the invention which refers to the accompanying drawings.

DETAILED DESCRIPTION OF THE FIGURES

An integrated device according to the present invention includes a silicon body in which one or more IC logic devices are formed and a III-nitride power semiconductor device formed over a surface of the silicon substrate and preferably operatively coupled to at least one of the IC logic devices.

Figure 1:
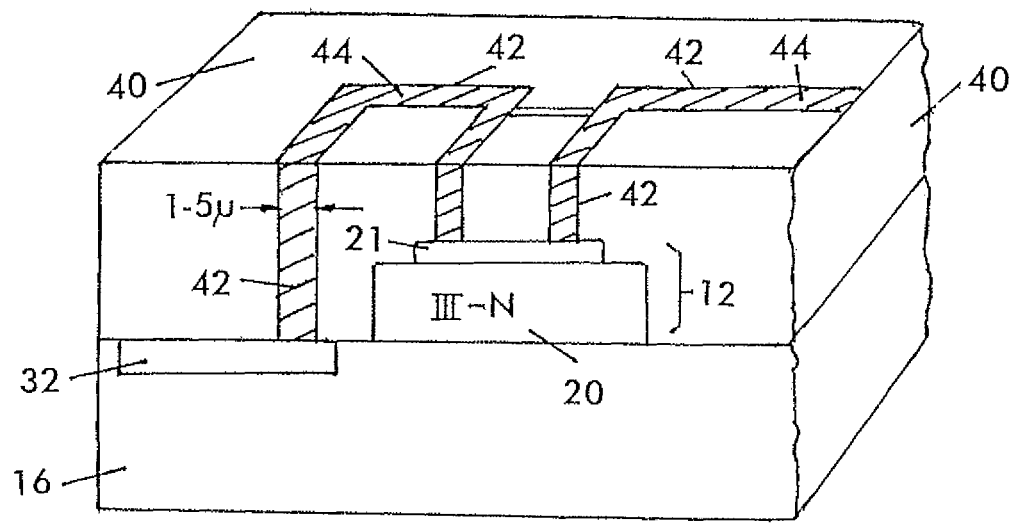
FIG. 1 illustrates a cross-sectional view of a first embodiment of the present invention.

Referring to FIG. 1, an integrated semiconductor device according to a first embodiment of the present invention includes an IC semiconductor logic device 32 formed in a silicon body 16, and a III-nitride power semiconductor device 12 formed over a major surface of silicon body 16. Note that IC device 32 is preferably positioned laterally to the III-nitride power device 12. In the preferred embodiment, III-nitride semiconductor device 12 may be a heterojunction power device having a schottky or an insulated gate such as a HEMT (high electron mobility transistor) examples of which are disclosed in U.S. Patent Application Publication No. 2006/0060871 and U.S. Pat. No. 5,192,987 or a III-nitride FET. IC semiconductor logic device 32 may be a silicon based driver or the like integrated circuit for driving III-nitride device 12.

According to an aspect of the present invention, an insulation body 40 (e.g., an oxide body such as $SiO_2$) is formed over IC semiconductor logic device 32 as well as III-nitride device 12. One or more vias 42 are opened in insulation body 40, each via 42 including a conductive (e.g. metal) filler 44 leading from an electrode of IC semiconductor logic device 32 to at least one electrode of III-nitride device 12. Thus, for example, a via 42 may lead from the gate electrode of III-nitride device 12 to an electrode of IC device 32 that supplies drive signals to the gate electrode.

To fabricate a device according to the present invention, first a semiconductor body 16 is prepared to serve as a substrate for HI-nitride device 12. Thereafter, a III-nitride body 20 (e.g. AlN) is formed over silicon body 16 using any desired technique. III-nitride body 20 may serve as a buffer layer or a transition layer.

Next, IC semiconductor logic device 32 is formed in silicon body 16 on a different plane lateral to III-nitride body 20, and then the rest of III-nitride device 12 is formed on III-nitride body 20 on silicon body 16. Thus, for example, a III-nitride heterojunction device such as a high electron mobility transistor may be formed by growing an active body 21 that includes an active III-nitride heterojunction over buffer layer 20. Alternatively, a III-nitride FET may be formed over III-nitride body 20.

Thereafter, insulation body 40 is formed and then planarized using, for example, CMP. Vias 42 are next opened in body 40 using any desired method and filled with conductors 44 to connect IC 32 and III-nitride device 12 to complete a device according to the present invention. Vias 42 may be 1-5 μm wide.

Note that the present invention is not limited to one III-nitride body 20, but multiple III-nitride bodies 20 each for at least one III-nitride device 12 can be provided without departing from the scope and spirit of the present invention.

Figure 2:
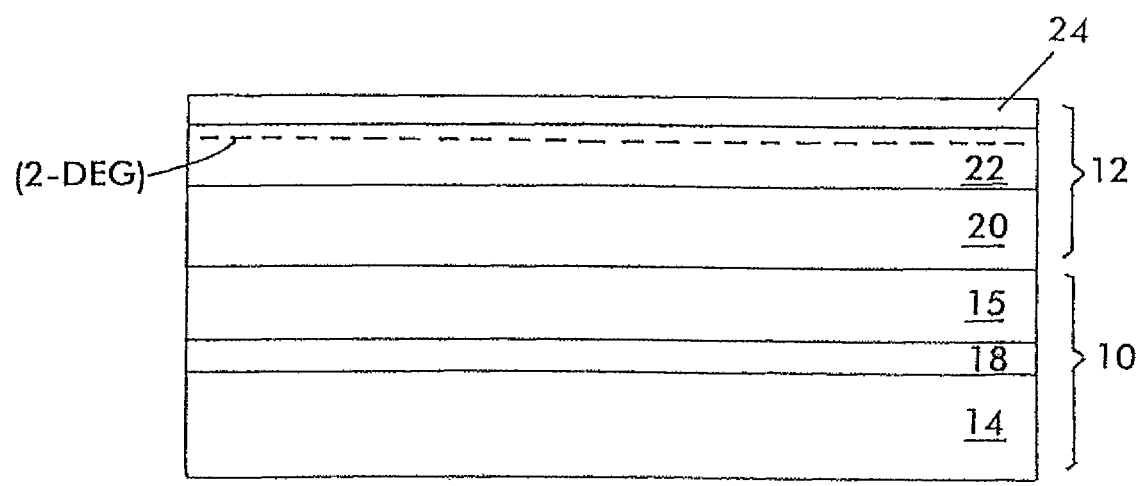
FIG. 2 illustrates a cross-sectional view of a semiconductor wafer for the fabrication of a device according to other embodiments of the present invention.

Referring to FIG. 2, a semiconductor wafer used for fabrication of a device according to the second embodiment of the present invention includes a support substrate 10 and a III-nitride semiconductor body 12 formed over support substrate 10.

According to an aspect of the present invention, support substrate 10 includes a first silicon body 14, a second silicon body 15 and an insulation body 18 interposed between first silicon body 14 and second silicon body 18. In one embodiment, first silicon body 14 may be a <111> single crystal silicon, second silicon body may be <111> single crystal silicon, and insulation body 18 may be silicon dioxide. In another embodiment, first silicon body 14 may be <100> silicon, second silicon body 15 may be <111> silicon, and insulation body 18 may be silicon dioxide.

In both embodiments, an SOI (silicon on insulator) substrate is suitable. Such substrates include two silicon substrates bonded to one another by a silicon dioxide layer. The first embodiment can also be realized by a SiMox process whereby implantation of oxygen into a <111> silicon substrate followed by an annealing step forms an insulation body 18 made of silicon dioxide between a first <111> silicon body 14 and a second <111> silicon body 15. Note that second silicon body 15 may optionally include an epitaxially grown layer thereon. Furthermore, note that other than SiMox, or silicon bonded to silicon, other methods can be used to realize a device according to the present invention.

III-nitride semiconductor device 12 includes, in one preferred embodiment, a III-nitride buffer layer 20 (e.g. AlN), over second silicon body 15, and a III-nitride heterojunction formed over III-nitride buffer layer 20, that includes a first III-nitride layer 22 having one band gap (e.g. GaN) and a second III-nitride layer 24 having another band gap (e.g. AlGaN, InAlGaN, InGaN, etc.) formed over first layer 22. The composition and/or the thickness of first and second III-nitride layers 22 and 24 are selected to result in the formation of a carrier rich region referred to as a two-dimensional electron gas (2-DEG) near the heterojunction thereof.

According to one aspect of the present invention, the III-nitride heterojunction can be used as the current carrying region of a III-nitride power semiconductor device (e.g. a high electron mobility transistor).

Figure 3:
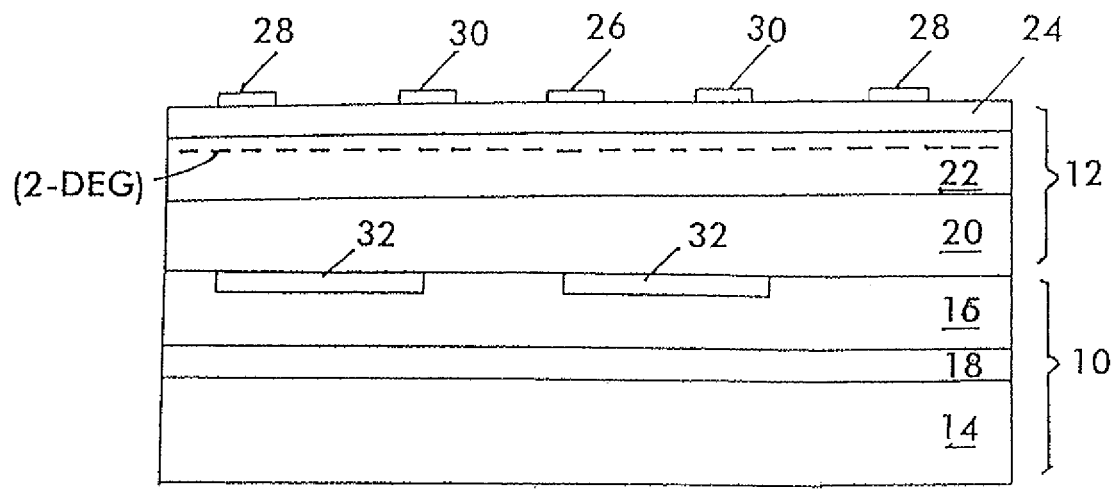
FIG. 3 illustrates a cross-sectional view of another III-nitride device according to the second embodiment of the present invention.

Referring to FIG. 3, a III-nitride high electron mobility transistor may include first and second power electrodes 26, 28 (e.g. source and drain electrodes) coupled to the 2-DEG through second III-nitride layer 24 and gate arrangements 30 each disposed between a respective first power electrode 26 and second power electrode 28. A gate arrangement may include an insulated gate electrode or a gate electrode that makes Schottky contact to second III-nitride layer 24.

In a device according to the first embodiment, active body 21 residing on buffer layer 20 may include a III-nitride heterojunction formed over III-nitride buffer layer 20, that includes a first III-nitride layer 22 having one band gap (e.g. GaN) and a second III-nitride layer 24 having another band gap (e.g. AlGaN, InAlGaN, InGaN, etc.) formed over first layer 22. The composition and/or the thickness of first and second III-nitride layers 22 and 24 are selected to result in the formation of a carrier rich region referred to as a two-dimensional electron gas (2-DEG) near the) heterojunction thereof. Furthermore, body 21 may include first and second power electrodes 26, 28 (e.g. source and drain electrodes) coupled to the 2-DEG through second III-nitride layer 24 and gate arrangements 30 each disposed between a respective first power electrode 26 and second power electrode 28. A gate arrangement may include an insulated gate electrode or a gate electrode that makes Schottky contact to second III-nitride layer 24. Thus, a III-nitride device 12 in the first embodiment may include features similar to those in the second embodiment.

In a device according to the second embodiment, semiconductor devices 32 may be formed in second silicon body 15. In one preferred embodiment, semiconductor devices 32 may be logic devices formed using CMOS technology for the purpose of operating the III-nitride device 12. For example, semiconductor devices 32 may be part of a driver circuit for driving III-nitride device 12. Note that in the second embodiment semiconductor devices 32 are disposed directly below III-nitride power device 12.

Figure 4:
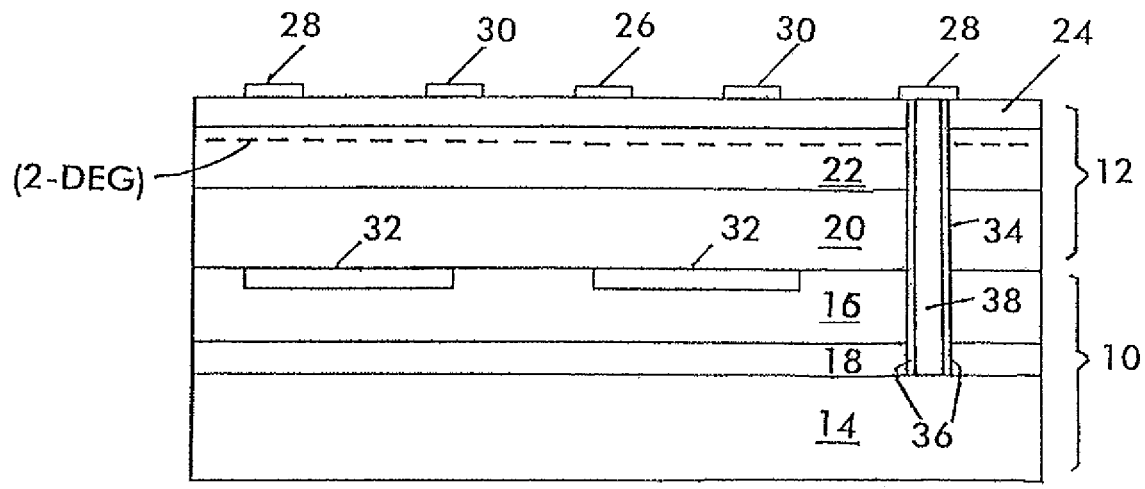
FIG. 4 illustrates a cross-sectional view of a third embodiment of a device according to the present invention.

Referring now to FIG. 4, according to the third embodiment, a via 34 that extends from the top of second III-nitride layer 24 to, for example, first silicon body 14 may be provided to allow for electrical communication between one of the power electrodes 28 (e.g. source or drain) and first silicon body 14. Via 34 may include an insulation body 36 on the walls thereof, and an electrically conductive body 38 (e.g. a metallic body or conductive semiconductor body such as polysilicon) connecting electrode 28 to first silicon body 14.

Figure 5:
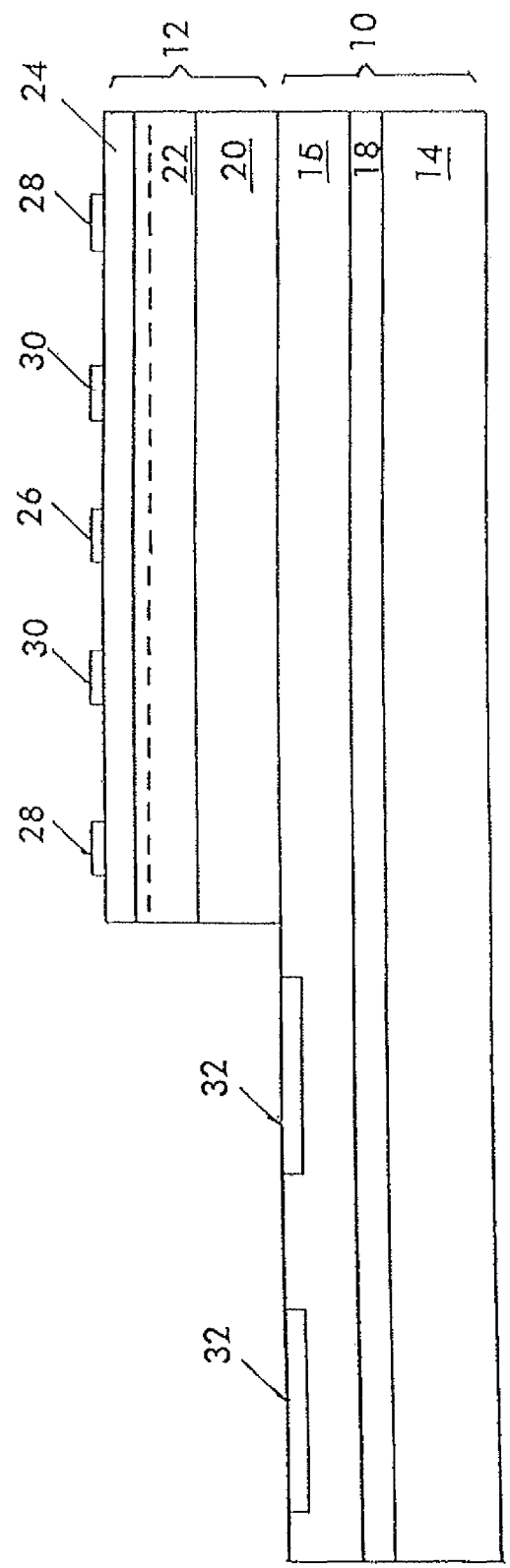
FIG. 5 illustrates a cross-sectional view of a fourth embodiment of a device according to the present invention.

Referring now to FIG. 5, in which like numerals identify like feature, in a device according to the fourth embodiment of the present invention, a portion of the III-nitride body 12 is removed to expose an area of second silicon body 15. Semiconductor devices 32 are formed in the exposed area of second silicon body 15 lateral to the III-nitride power device 12, rather than being disposed directly below the III-nitride power semiconductor device 12.

A wafer used in a device according to the present invention can be used to devise power devices for high voltage applications because of the presence of insulation body 18, which reduces leakage current into the substrate and improves the breakdown voltage of the device. For example, when insulation body 18 is silicon dioxide, its thickness can be 0.1 to 2 microns to increase the breakdown voltage of the device. In one embodiment, for instance, silicon body 18 may be about 0.5 microns thick for a 700-1000 volt III-nitride power device.

Note further that silicon body 14 and/or silicon body 15 may be doped with N-type dopants or P-type dopants. Thus, silicon bodies 14, 16 may be N++ doped or P++ doped. N++ doped or P++ doped first silicon body can improve the breakdown capability of the device by taking advantage of the resurf effect.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An integrated semiconductor device comprising:
   a silicon device situated in a silicon body;
   said silicon body comprising an upper lateral surface that contacts a lower lateral surface of a III-nitride body;
   a III-nitride device situated over said III-nitride body;
   said silicon device being situated in a different plane relative to said III-nitride device;
   said silicon device being coupled to said III-nitride device;
   a first conductive via coupled to said silicon device and second conductive via coupled to said III-nitride device,
   wherein a portion of the upper lateral surface of said silicon body is not covered by said III-nitride body, and
   wherein said silicon device is situated directly underneath said portion of the upper lateral surface of said silicon body.

2. The integrated semiconductor device of claim 1 wherein an insulation body is situated over said silicon body and over said III-nitride body, and wherein said at least one via is situated in said insulation body.

3. The integrated semiconductor device of claim 1 wherein said first conductive via couples said silicon device to a gate electrode of said III-nitride device.

4. The integrated semiconductor device of claim 1 wherein said silicon device is an IC device, and wherein said IC device supplies drive signals to a gate electrode of said III-nitride device by said first conductive via.

5. The integrated semiconductor device of claim 1 wherein said silicon device is situated in said different plane relative to a gate electrode of said III-nitride device, and wherein said first conductive via couples said silicon device to said gate electrode of said III-nitride device.

6. The integrated semiconductor device of claim 4 wherein said IC device is situated in said different plane relative to said gate electrode of said III-nitride device, and wherein said first conductive via supplies said driver signals to said gate electrode of said III-nitride device.

7. The integrated semiconductor device of claim 1, wherein said III-nitride device includes a III-nitride heterojunction comprising a first III-nitride layer of one band gap and a second III-nitride layer of another band gap formed over said first III-nitride layer.

8. The integrated semiconductor device of claim 7, wherein said III-nitride body includes a buffer layer interposed between said III-nitride heterojunction and said silicon body.

9. The integrated semiconductor device of claim 1 wherein said silicon device is situated in said different plane relative to power electrodes of said III-nitride device.

10. The integrated semiconductor device of claim 4 wherein said IC device is situated in said different plane relative to power electrodes of said III-nitride device.

11. The integrated semiconductor device of claim 1 wherein said silicon body includes an epitaxially formed portion.

12. The integrated semiconductor device of claim 1 wherein said III-nitride device is a power III-nitride device and said silicon device is an IC device for driving said power III-nitride device.

13. The integrated semiconductor device of claim 1 wherein a conductor disposed within said first via connects an electrode of said III-nitride device to said silicon device.

14. The integrated semiconductor device of claim 1, wherein said III-nitride device is a high-electron-mobility transistor.

15. The integrated semiconductor device of claim 1, further comprising an insulation body formed on the silicon body and surrounding the III-nitride body and III-nitride device, said insulation body comprising a lower surface directly contacting the upper lateral surface of the silicon body and an upper surface opposite the lower surface, wherein said upper surface of the insulation body extends along a single plane, and wherein said first conductive via and said second conductive via each comprise an upper surface that is coplanar with said upper surface of the insulation body.

* * * * *

UNITED STATES PATENT AND TRADEMARK OFFICE
CERTIFICATE OF CORRECTION

PATENT NO. : 11,605,628 B2
APPLICATION NO. : 13/945276
DATED : March 14, 2023
INVENTOR(S) : Briere Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 332 days.

Signed and Sealed this
First Day of July, 2025

Coke Morgan Stewart
*Acting Director of the United States Patent and Trademark Office*